US006924560B2

United States Patent
Wang et al.

(10) Patent No.: US 6,924,560 B2
(45) Date of Patent: Aug. 2, 2005

(54) COMPACT SRAM CELL WITH FINFET

(75) Inventors: Ping-Wei Wang, Taipei (TW);
Chang-Ta Yang, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/637,322

(22) Filed: Aug. 8, 2003

(65) Prior Publication Data

US 2005/0029556 A1 Feb. 10, 2005

(51) Int. Cl.$^7$ .............................................. H01L 27/11
(52) U.S. Cl. ...................... 257/903; 257/67; 257/68; 257/69; 257/379; 257/380; 257/381; 257/904
(58) Field of Search .......................... 257/66–69, 351, 257/369, 377, 382, 385, 388, 393, 903, 390, 368, 381, 413, 904, 538; 365/154, 156, 180, 182

(56) References Cited

U.S. PATENT DOCUMENTS

| | | | | |
|---|---|---|---|---|
| 5,296,729 A | * | 3/1994 | Yamanaka et al. ........... 257/377 |
| 5,298,782 A | * | 3/1994 | Sundaresan ................. 257/393 |
| 5,373,170 A | * | 12/1994 | Pfiester et al. ................. 257/69 |
| 5,396,105 A | * | 3/1995 | Nakayama .................... 257/385 |
| 5,521,860 A | | 5/1996 | Ohkubo |
| 5,523,598 A | * | 6/1996 | Watanabe et al. ............ 257/301 |
| 5,661,325 A | * | 8/1997 | Hayashi et al. .............. 257/393 |
| 6,147,385 A | | 11/2000 | Kim et al. .................... 257/369 |
| 6,252,284 B1 | | 6/2001 | Muller et al. ................ 257/412 |
| 6,372,565 B2 | * | 4/2002 | Kim ............................ 438/200 |
| 6,413,802 B1 | | 7/2002 | Hu et al. ...................... 438/151 |
| 6,445,017 B2 | * | 9/2002 | Song ............................ 257/204 |
| 6,765,303 B1 | * | 7/2004 | Krivokapic et al. ........... 257/25 |
| 2003/0102518 A1 | * | 6/2003 | Fried et al. .................. 257/401 |

* cited by examiner

Primary Examiner—Andy Huynh
(74) Attorney, Agent, or Firm—Duane Morris LLP

(57) ABSTRACT

A method and system is disclosed for an SRAM device cell having at least one device of a first semiconductor type and at lease one device of a second semiconductor type. The cell has a first device of the first type constructed as a part of a first FinFET having one or more devices of the first type, a first device of the second type whose poly region is an extension of a poly region of the first device of the first type with no contact needed to connect therebetween, wherein the two devices are constructed using a silicon-on-insulator (SOI) technology so that they are separated by an insulator region therebetween so as to minimize the distance between the two devices.

20 Claims, 4 Drawing Sheets

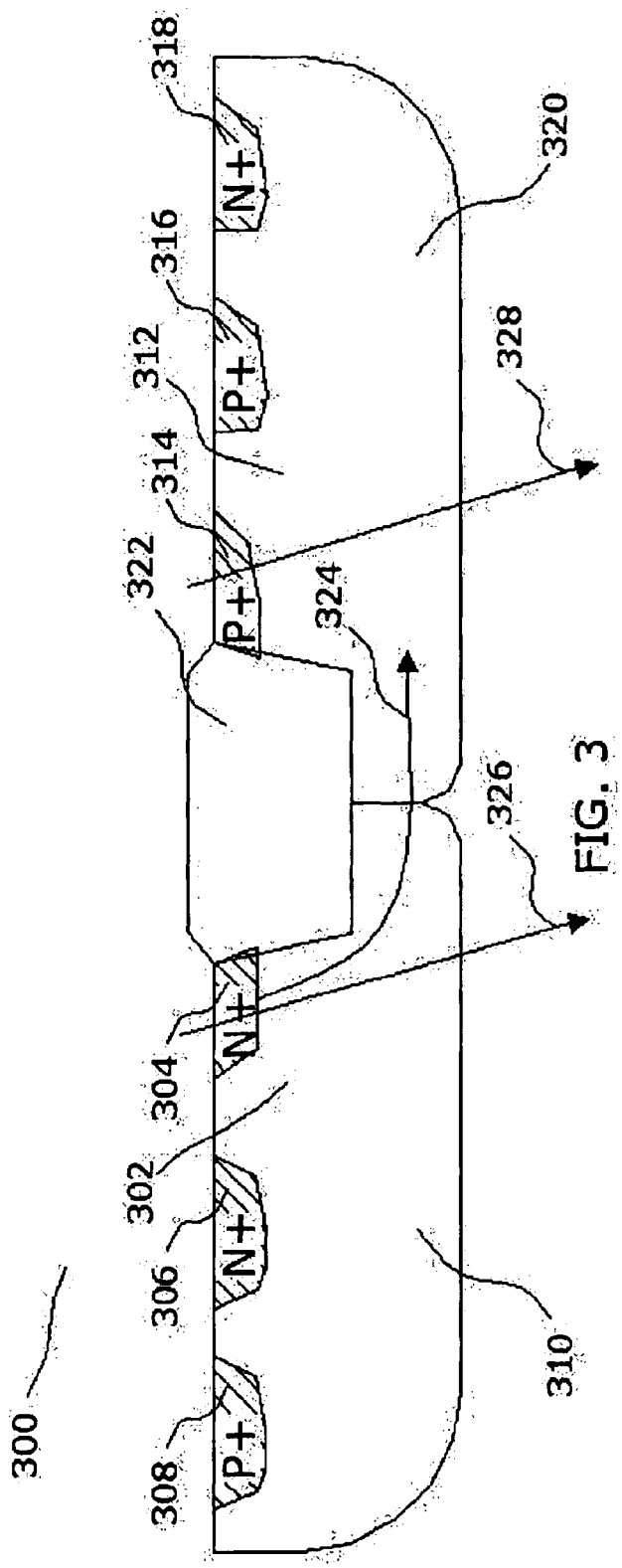
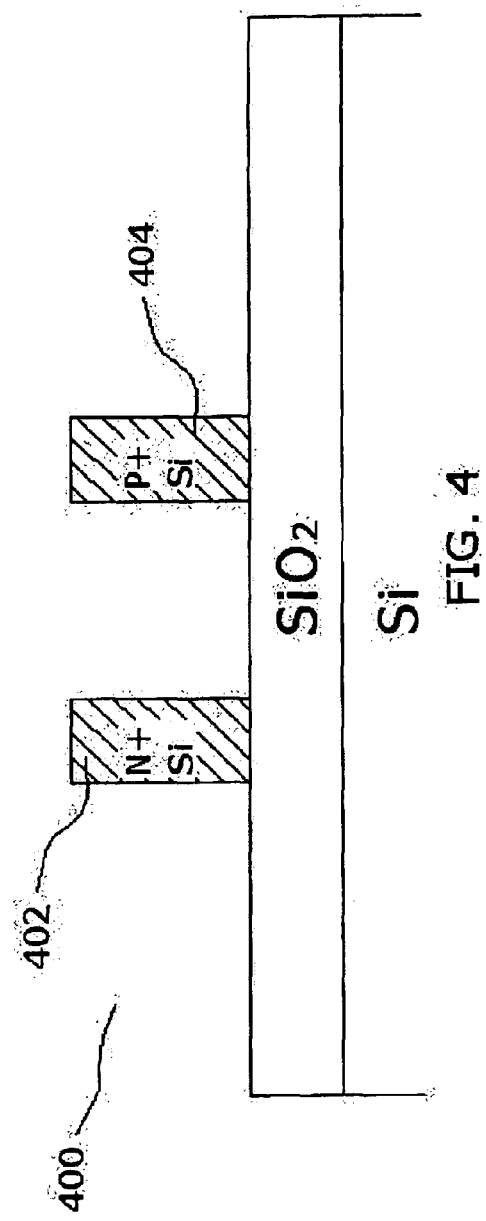
FIG. 3
FIG. 4

COMPACT SRAM CELL WITH FINFET

BACKGROUND OF THE DISCLOSURE

This invention relates generally to transistors, and more particularly, to a compact memory transistor cell.

Metal-oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling". As MOSFETs are scaled to channel lengths below 100 nm, conventional MOSFETs suffer from several problems. In particular, interactions between the source and drain of the MOSFET degrade the ability of the gate of the same to control whether the device is on or off. This phenomenon is called the "short-channel effect" (SCE).

A conventional SRAM cell is comprised of first and second driver transistors whose drain-source paths are respectively connected between first and second storage nodes and ground, first and second load elements connected between the first and second storage nodes and power supply, respectively, first and second switching transistors whose drain-source paths are respectively connected between the first and second storage nodes and a pair of data lines (or bit lines). Gates of the first and second driver transistors are connected to the second and first storage nodes, respectively, and gates of the first and second switching transistors are connected to a word line.

SRAM cells may generally be classified according to the manufacturing configuration of the load elements used in the cells. A high resistance SRAM cell uses as load elements layers of high-resistance material such as polycrystalline silicon (typically called "polysilicon") on an insulating layer over a semiconductor substrate in which the first and second driver transistors and the first and second switching transistors are formed. A thin-film SRAM cell uses as load elements thin-film transistors on an insulating layer over the semiconductor substrate on which the four transistors are formed. In a CMOS SRAM cell, first and second load transistors complementary to the first and second driver transistors are formed on the semiconductor substrate together with the other transistors.

With the scaling down of the manufacturing technology, what is needed is an improved SRAM that may be efficiently constructed.

SUMMARY OF THE DISCLOSURE

A method and system is disclosed for an SRAM device cell having at least one device of a first semiconductor type and at lease one device of a second semiconductor type. The cell has a first device of the first type constructed as a part of a first FinFET having one or more devices of the first type, a first device of the second type whose poly region is an extension of a poly region of the first device of the first type with no contact needed to connect therebetween, wherein the two devices are constructed using a silicon-on-insulator (SOI) technology so that they are separated by an insulator region therebetween so as to minimize the distance between the two devices.

The aspects and advantages of the present disclosure will become apparent from the following detailed description, taken in conjunction with the accompanying drawings, illustrating by way of example the principles of the disclosure.

BRIEF DESCRIPTION OF THE DRAWINGS

FIG. 3 is a cross section of bulk NMOS and PMOS transistors with leakage paths.

FIG. 4 is a FinFET on SOI without leakage paths.

DETAILED DESCRIPTION

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this becomes increasingly difficult, since the distance between the source and drain is reduced, and hence, increasing the interaction with the channel, reducing gate control and increasing short channel effects. SOI is also advantageous since it reduces unwanted coupling between the source and the drain of the adjacent MOSFET through the region of the well below STI/LOCOS oxide isolation. Therefore, via the SOI process, the space between the source region of a device and the drain region of another device can be minimized.

Another emerging technology is a gate field effect transistor (FinFET), whose fabrication process is compatible with conventional MOSFET fabrication processes. The double-gate MOSFET structure FinFET is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. The device channel comprises a thin silicon fin standing on an insulative layer (e.g. silicon oxide) with the gate overlying the sides of the fin. Thus inversion layers are formed on the sides of the channel with the channel film being sufficiently thin such that the two gates control the entire channel film and limit modulation of channel conductivity by the source and drain. The thickness of the film is chosen such that it is less or equal to $7/10$ths of the channel length. In most implementations, the channel film width is less than the channel length such that the channel of the device resembles a long thin film.

An extension of the double-gate concept is the "surround-gate" or "wraparound-gate" concept, where the gate is placed such that it completely or almost-completely surrounds the channel, providing better gate control.

In the following description, an improved compact memory cell is illustrated using incorporating both the FinFET and SOI technologies. Specific details are set forth. However, it will be understood by those skilled in the art that these specific details are not required to practice the invention. For example, n-channel type NMOS transistors may be replaced by p-channel type PMOS transistors, and vice versa.

Figure 1:
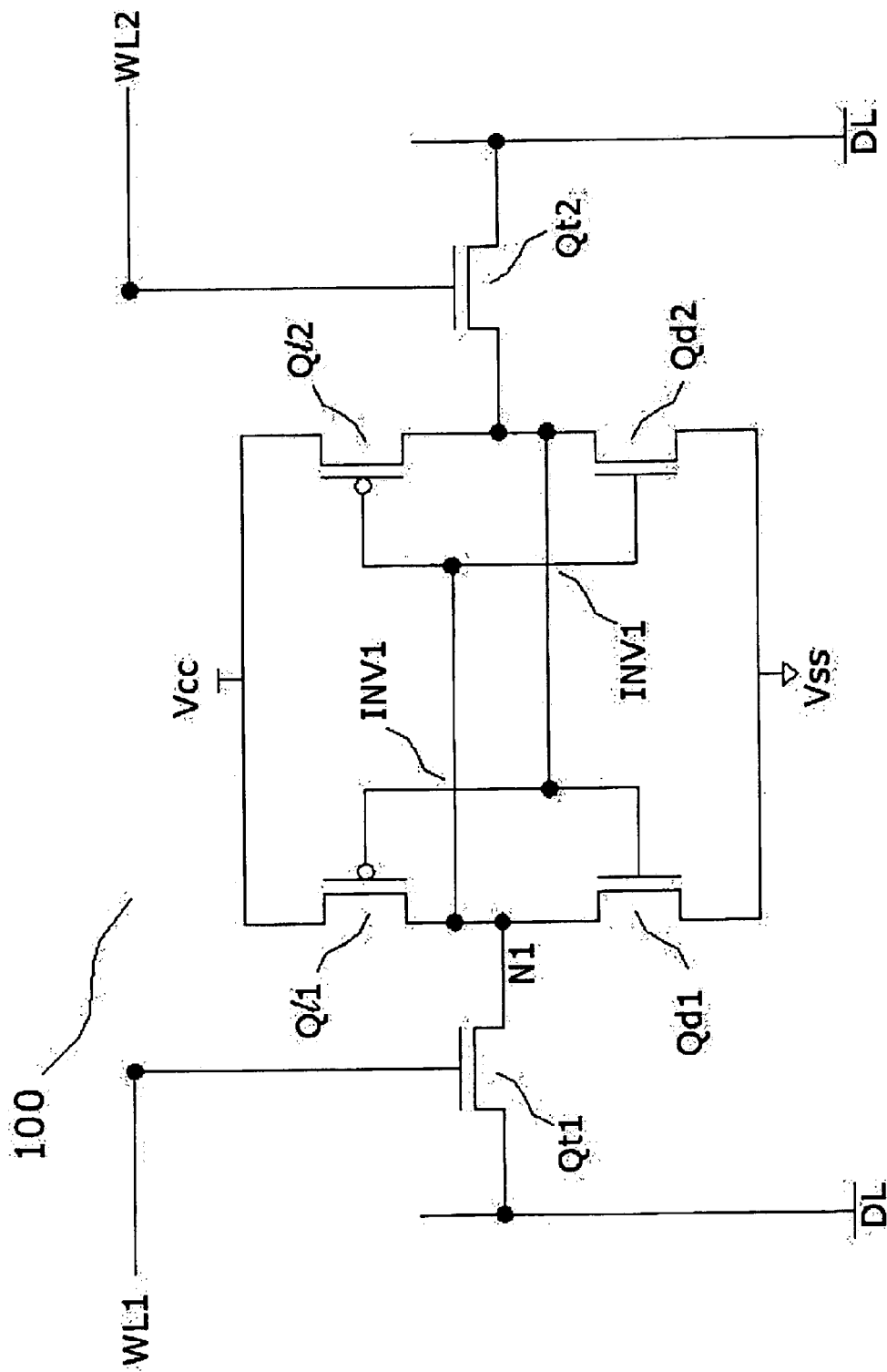
FIG. 1 is an electronic circuit diagram of a CMOS SRAM cell with split word line (SWL).
Figure 2:
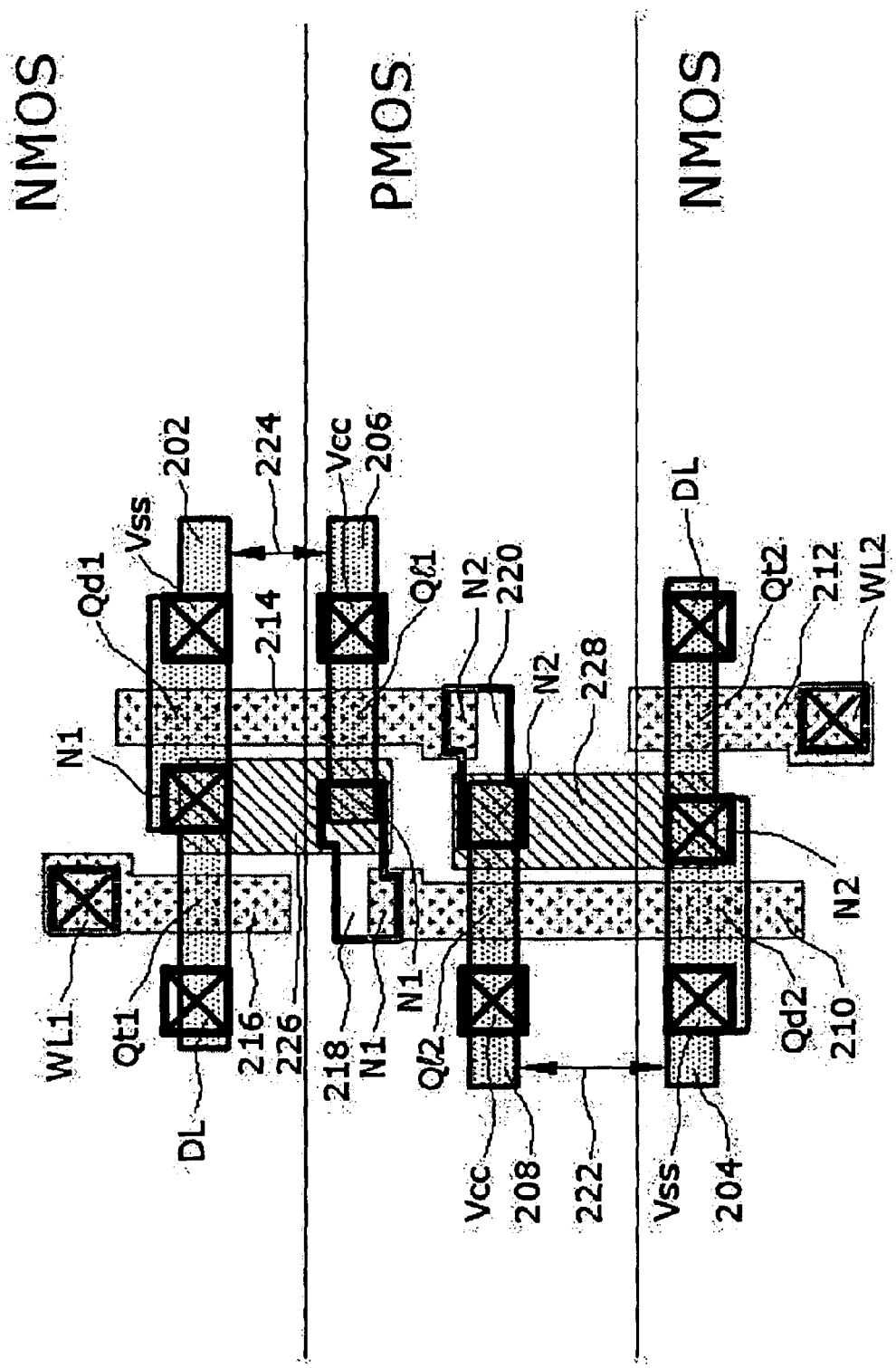
FIG. 2 is a chip layout showing three material layers of a single cell of a CMOS SRAM of FinFET structure on SOI with SWL according to one example of the present disclosure.

FIG. 1 is a circuit diagram of an SRAM cell. FIG. 2 is an enlarged plan view showing a layout diagram of a single cell of a complementary metal-oxidesilicon-silicon (CMOS) static random access memory (SRAM) circuit of a FinFET structure on silicon-on-insulator (SOI) with split word line (SWL). However, the circuit is not limited to split word line. For example, the first word line (WL1) and second word line (WL2) may be joined into a single word line.

Referring to FIG. 1, the CMOS SRAM cell is composed of a flip-flop having cross-coupled first and second inverters INV1 and INV2, and a first and second transfer transistors Qt1 and Qt2 coupled to the flip-flop. The first inverter INV1 includes a first load transistor Ql1 and a first driver transistor Qd1 and the second inverter INV2 includes a second load transistor Ql2 and a second driver transistor Qd2. The first and second transfer transistors Qt1 and Qt2 and the first and second driver transistors Qd1 and Qd2 are first conductivity-type channel, i.e., n-channel, insulated gate field effect transistors, and the first and second load transistors Ql1 and Ql2 are second conductivity-type channel, i.e., p-channel insulated gate field effect transistors. First and second inverters INV1 and INV2 include not only a first and second diffusion regions, i.e., source regions, of a first and second driver transistors Qd1 and Qd2, which are connected to a ground source (or ground voltage Vss), but also a third and fourth diffusion regions, i.e. drain regions, of the first and second load transistors Ql1 and Ql2, which are connected to a power supply source (or power supply voltage Vcc).

A single CMOS SOI FinFET SRAM cell region 200 in FIG. 2 shows one example of the present disclosure. A first active region 202 is a silicon fin for NMOS transistors Qd1 and Qt1. The second active region 204 is a silicon fin for NMOS transistors Qd2 and Qt2. The third active region 206 is a silicon fin for PMOS transistor Ql1. The fourth active region 208 is a silicon fin for PMOS transistor Ql2. Qd1 has a source contacted by Vss, a drain contacted by storage node N1, and a gate region located where gate electrode 214 overlaps the vertical and horizontal surfaces of the active region formed by silicon fin 202. Qt1 has a source contacted by a data line DL, a drain connected by N1, and a gate region located where gate electrode 214 overlaps the vertical and horizontal surfaces of the active region formed by silicon fin 202. Qd2 has a source contacted by Vss, a drain contacted by storage node N2, and a gate region located where gate electrode 210 overlaps the vertical and horizontal surfaces of the active region formed by silicon fin 204. Qt2 has a source contacted by data line DL, a drain contacted by N2, and a gate region located where gate electrode 212 overlaps the vertical and horizontal surfaces of the active region formed by silicon fin 204. Ql1 has a source contacted by Vcc, a drain contacted by N1, and a gate region located where gate electrode 214 overlaps the vertical and horizontal surfaces of the active region formed by silicon fin 206. Ql2 has a source contacted by Vcc, a drain contacted by N2, and a gate region located where gate electrode 210 overlaps the vertical and horizontal surfaces of the active region formed by silicon fin 208. Gate electrode 210 is contacted to storage node N1 at one end. Gate electrode 212 is contacted to word line 2 (WL2). Gate electrode 214 is contacted to storage node N2 at one end, Gate electrode 216 is contacted to word line 1 (WL1). The N1 contact of gate electrode 210 is connected to the N1 contact of the active region formed by silicon fin 206 by Butted Contact 218. The N2 contact of gate electrode 214 is connected to the N2 contact of the active region formed by silicon fin 208 by Butted Contact 220. The N1 contact of the active region formed by silicon fin 202 is connected to the N1 Butted Contact 218 by a second level of metal 226. The N2 contact of the active region formed by silicon fin 204 is connected to the N2 Butted Contact 220 by a second level of metal 228.

A spacing 222 exists between the NMOS active region formed by silicon fin 204 and the PMOS active region formed by silicon fin 208. A similar spacing 224 exists between the NMOS active region formed by silicon fin 202 and the PMOS active region formed by silicon fin 206. An advantage of this embodiment is that both of these spacings may be reduced by the combination of CMOS, SOI, and FinFET in SRAM layout. Such a distance between the two active regions of the FinFETs is only needed to be equal to or a little more than the minimum required distance between any two active regions according to a design rule of a predetermined generation of technology.

The two driver transistors in the SOI FinFET SRAM, Qd1 and Qd2, can be designed to carry more power than the others and yet fit within a relatively small surface area. In FIG. 2, a wide section of silicon fin 202 is shown for driver transistor Qd1, and a wide section of silicon fin 204 is shown for driver transistor Qd2 to simply produce this advantage.

FIG. 3 illustrates a sectional view of an SRAM cell 300. It shows a bulk NMOS transistor 302 with N+ source 304, N+ drain 306, and P+ contact 308 in a P-well 310. Also shown is a bulk PMOS transistor 312 with P+ source 314, P+ drain 316, and N+ contact 318 in an N-well 320. Also shown is local-oxide-silicon (LOCOS) 322, which is a thick oxide layer separating the transistors. Current path 324 is known as a transistor-to-transistor leakage path. Current leakage path 326 is a parasitic NPN bipolar transistor leakage inherent in bulk NMOS transistors. Current leakage path 328 is a parasitic PNP bipolar transistor leakage inherent in bulk PMOS transistors.

FIG. 4 is a sectional view of a FinFET 400. It shows an N+ doped silicon fin 402 standing vertically on a silicon dioxide insulating layer. Also shown is a P+ doped silicon fin 404 standing vertically on the silicon dioxide insulating layer. An advantage of the present invention is that the three leakage paths shown in FIG. 3 are not in existence with FinFET-on-SOI structure. A further advantage is that the vertical FinFET transistors may be spaced more closely together with less leakage penalty than may horizontal bulk MOS transistors. A further advantage is that neither local-oxide-silicon, LOCOS, nor shallow trench isolation, STI, is necessary. Therefore, in one example, the separation between the NMOS and PMOS transistors shrinks from a minimum required 0.44 micron to 0.14 micron. The surface area of a memory cell is also reduced since no N-well or P-well contacts are required.

Figure 5:
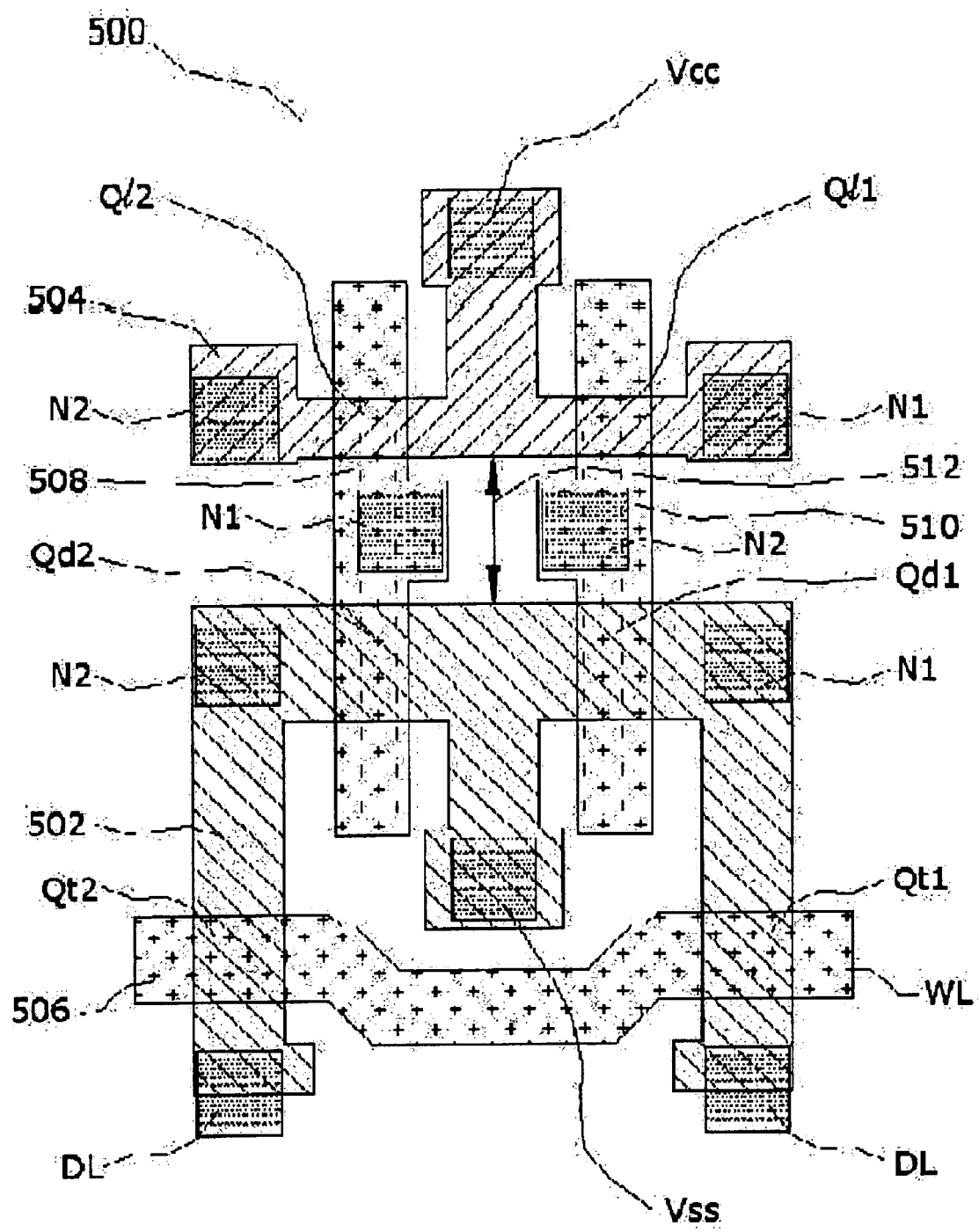
FIG. 5 is a chip layout showing two material layers of a single cell of a CMOS SRAM of FinFET structure on SOI with SWL according to another example of the present disclosure.

FIG. 5 is an enlarged plan view showing a unique layout diagram of a single cell of a CMOS SRAM circuit with a FinFET structure on SOI. This single cell region 500 shows another example of the present disclosure. The labeled components are identical to the similarly labeled components in FIG. 2. The SRAM circuit function is identical to that of the SRAM circuit in FIG. 2. The cell 500 as shown has a first fin active region 502, a second fin active region 504, a gate electrode region 506, two poly regions 508 and 510 and various contacts.

From FIG. 2, the first active region forming silicon fin 202 and the second active region forming silicon fin 204 have been combined into one single active region forming silicon fin 502 in FIG. 5 for NMOS transistors with only one combined Vss contact. As in FIG. 2, the gate region of Qd1 is located where gate electrode 510 overlaps with the vertical and horizontal surfaces of the active region formed by silicon fin 502. The gate region of Qd2 is located where gate electrode 508 overlaps with the vertical and horizontal surfaces of the active region formed by silicon fin 502. The gate region of Qt1 is located where gate electrode 506 overlaps the vertical and horizontal surfaces of the active region formed by silicon fin 502 near N1. The gate region of Qt2 is located where gate electrode 506 overlaps the vertical and horizontal surfaces of the active region formed by silicon fin 502 near N2. Gate electrode 506 forms a single word line, but it could be split between Qt1 and Qt2 to form a split word line.

The third active region formed by silicon fin 206 and the fourth active region formed by silicon fin 208 have been combined into one single active region formed by silicon fin 504 in FIG. 5 for PMOS transistors with only one combined Vcc contact. As in FIG. 2, the gate region of Ql1 is located where gate electrode 510 overlaps with the vertical and horizontal surfaces of the active region formed by silicon fin 504. The gate region of Ql2 is located where gate electrode 508 overlaps with the vertical and surfaces of the active region formed by silicon fin 504.

A spacing, 512 is identified to show the shortened distance between the NMOS active region formed by silicon fin 502 and the PMOS active region formed by silicon fin 504. An advantage of this layout is that this spacing 512 has been greatly reduced. Again, such a distance between the two active regions of the FinFETs is only needed to be equal to or a little more than the minimum required distance between any two active regions according to a design rule of a predetermined generation of technology.

The reduction from the four active regions formed by the four silicon fins 202,204,206, and 208 in FIG. 2 to the two active regions formed by the two silicon fins 502 and 504 in FIG. 5 reduces the number of required contacts and furthger reduces the size of the SRAM memory cell.

The combination of FinFET and SOI technologies applied to an SRAM integrated circuit offers specific improvements of structure, layout, and performance compared with experience with bulk SRAMs. For instance, in the above examples, the double gates on the channel fin effectively suppress SCE and enhance drive current. In some embodiments, a plurality of channels can be provided between source and drain regions and since the channel is thin and the fins are parallel, vertical fields are reduced thereby reducing the degradation and mobility typically caused by vertical fields. Further, since the fin is thin, doping of the fin is not required to suppress SCE and undoped silicon can be used as the device channel, thereby reducing mobility degradation due to impurity scattering. Further, the threshold voltage of the device may be controlled by adjusting the work function of the gate by using a silicon-germanium alloy or a refractory metal of its compound such as titanium nitride.

In addition, the structure eliminates vertical and lateral leakage paths in an SRAM. Since neither LOCOS nor STI is required, the chip layout for an SRAM is more compact. Also, this combination in an SRAM makes it especially convenient to combine all NMOS structures into one silicon fin connected to Vss/ground and all PMOS structures into one other silicon fin connected to Vcc/power supply. Some contacts are thereby eliminated and the device is compacted. It is adaptable to either single word line or split word line, SWL. It allows closer spacing of active elements, with less leakage penalty. It allows butted contacts. It obviates contacts to N-wells and P-wells, which saves space. It allows the enlargement of some components, such as SRAM driver transistors, with little space penalty.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. An SRAM device cell having at least one device of a first semiconductor type and at lease one device of a second semiconductor type, comprising:
    a first device of the first type constructed as a part of a first FinFET having one or more devices of the first type;
    a first device of the second type whose poly region is an extension of a poly region of the first device of the first type with no contact needed to connect there between;
        wherein an active region of the first device of the second type is connected to a poly region of a second device of the second type,
        wherein the two devices are constructed using a silicon-on-insulator (SOI) technology so that they are separated by an insulator region there between so as to minimize the distance between the two devices.

2. The SRAM device cell of claim 1 wherein the first FinFET further includes a second P type device.

3. The SRAM device cell of claim 1 wherein the active region of the first device of the second type is connected by sharing a butted contact.

4. The SRAM device cell of claim 1 wherein the first device of the first type is a driver transistor.

5. The SRAM device cell of claim 1 wherein the first device of the second type is a load transistor.

6. The SRAM device cell of claim 1 wherein the two devices are connected in series.

7. The SRAM device cell of claim 1 wherein the distance between the two devices is a minimum required distance between two active regions according to a design rule for a predetermined generation of technology.

8. An SRAM device cell having at least one device of a first semiconductor type and at lease one device of a second semiconductor type, comprising:
    a first device of the first type constructed as a part of a first FinFET having one or more devices of the first type;
    a first device of the second type whose poly region is an extension of a poly region of the first device of the first type with no contact needed to serially connect there between,
    wherein the two devices are constructed using a silicon-on-insulator (SOI) technology so that they are separated by an insulator region there between so as to minimize the distance between the two devices,
    wherein the first device of the second type is connected to a positive power supply and the first device of the first type is connected to a negative power supply or ground.

9. An SRAM device cell having at least one device of a first semiconductor type and at least one device of a second semiconductor type, comprising:

a first device of the first type constructed as a part of a first FinFET having one or more devices of the first type; and a first device of the second type constructed as a part of a second FinFET having one or more devices of the second type, wherein an active region of the first device of the second type is connected to a poly region of a second device of the second type, wherein the first and second devices share a poly region, and wherein the two devices are constructed using a silicon-on-insulator (SOI) technology so that they are separated by an insulator region so as to minimize the distance between two active regions for the FinFETs.

10. The SRAM device cell of claim 9 wherein the distance between two active regions for the FinFETs is equal to or more than a minimum required distance between two active regions according to a design rule of a predetermined generation of technology.

11. The SRAM device cell of claim 9 wherein the second FinFET further includes a second device of the first type.

12. The SRAM device cell of claim 9 wherein the first device of the first type is a load transistor.

13. The SRAM device cell of claim 9 wherein the first device of the second type is a driver transistor.

14. The SRAM device cell of claim 9 wherein the second device of the first type is a transfer transistor.

15. An SRAM device cell having at least one device of a first semiconductor type and at lease one device of a second semiconductor type, comprising:

a first device of the first type constructed as a part of a first FinFET having one or more devices of the first type; and a first device of the second type constructed as a part of a second FinFET having one or more devices of the second type, wherein the first and second devices share a poly region, wherein the two devices are constructed using a silicon-on-insulator (SOI) technology so that they are separated by an insulator region so as to minimize the distance between two active regions for the FinFETs, wherein the first device of the first type is connected to a positive power supply and the first device of the second type is connected to a negative power supply or ground.

16. An SRAM device cell comprising:

a first FinFET having a first and second load devices of a first type; and a second FinFET having a first and second driver devices of a second type, wherein an active region of the first device of the second type is connected to a poly region of a second device of the second type, wherein the first load device and the first driver device share a first poly region, wherein the second load device and the second driver device share a second poly region, and wherein the two FinFETs are constructed using a silicon-on-insulator (SOI) technology so that active regions thereof are separated by an insulator region so as to minimize the distance therebetween.

17. The SRAM device cell of claim 16 wherein the distance between the two active regions for the FinFETs is equal to or more than a minimum required distance between two active regions according to a design rule of a predetermined generation of technology.

18. The SRAM device cell of claim 16 wherein the active region of the first FinFET between the two poly regions is connected to Vcc.

19. The SRAM device cell of claim 16 wherein the active region of the second FinFET between the two poly regions is connected to Vss.

20. An SRAM device cell comprising:

a first FinFET having a first and second load devices of a first type; and a second FinFET having a first and second driver devices of a second type, wherein the first load device and the first driver device share a first poly region, wherein the second load device and the second driver device share a second poly region, wherein the two FinFETs are constructed using a silicon-on-insulator (SOI) technology so that active regions thereof are separated by an insulator region so as to minimize the distance therebetween, wherein the second FinFET further includes two transfer transistors of the second type.

* * * * *